(12) United States Patent
Han et al.

(10) Patent No.: US 7,358,108 B2
(45) Date of Patent: Apr. 15, 2008

(54) CMOS IMAGE SENSOR AND METHOD FOR FABRICATING THE SAME

(75) Inventors: Chang Hun Han, Kyunggido (KR); Bum Sik Kim, Kyunggido (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/022,890

(22) Filed: Dec. 28, 2004

(65) Prior Publication Data

US 2005/0156213 A1 Jul. 21, 2005

(30) Foreign Application Priority Data

Dec. 31, 2003 (KR) .................. 10-2003-0101553

(51) Int. Cl.
*H01L 21/76* (2006.01)
(52) U.S. Cl. .................. 438/60; 438/433; 438/447; 257/514; 257/515
(58) Field of Classification Search ............... 438/433, 438/447; 257/514, 515
See application file for complete search history.

(56) References Cited

U.S. PATENT DOCUMENTS

| 6,265,743 | B1 * | 7/2001 | Sakai et al. .................. 257/305 |
| 6,949,445 | B2 * | 9/2005 | Rhodes et al. ............... 438/424 |
| 2003/0127666 | A1 * | 7/2003 | Lee ............................ 257/225 |

FOREIGN PATENT DOCUMENTS

| JP | 2003-142674 | 5/2003 |
| JP | 2003-188367 | 7/2003 |
| JP | 2003-318379 | 11/2003 |
| JP | 2004-039832 | 2/2004 |

OTHER PUBLICATIONS

Moroz, V. et al. Modeling Facet Formation for Non-Planar Thermal Oxidation of Silicon, IEEE. Sep. 11-13, 2001, http://ieeexplore.ieee.org/xpls/abs_all.jsp?arnumber=1506660.*

Lee, Y. J. et al. Effects of Post Annealing And Oxidation Processes on the Removal of Damage Generated During the Shallow Trench Etch Process, IEEE. Jul. 13-16, 1998, http://ieeexplore.ieee.org/xpls/abs_all.jsp?arnumber=730057.*

Office Action from the Japanese Intellectual Property Office, dated May 9, 2006, in counterpart Japanese Patent Application No. 2004-369171.

* cited by examiner

*Primary Examiner*—Steven Loke
*Assistant Examiner*—Earl Taylor
(74) *Attorney, Agent, or Firm*—Finnegan, Henderson, Farabow, Garrett, & Dunner, L.L.P.

(57) ABSTRACT

A CMOS image sensor and a method for fabricating the same are disclosed, in which the boundary between an active region and a field region is not damaged by ion implantation. The method for fabricating a CMOS image sensor includes forming a trench in a first conductive type semiconductor substrate, forming a first conductive type heavily doped impurity ion region in the semiconductor substrate at both sides of the trench, forming a device isolation film by interposing an insulating film between the trench and the device isolation, sequentially forming a gate insulating film and a gate electrode on the semiconductor substrate, and forming a second conductive type impurity ion region for a photodiode in the semiconductor substrate between the gate electrode and the device isolation film.

6 Claims, 9 Drawing Sheets

CMOS IMAGE SENSOR AND METHOD FOR FABRICATING THE SAME

This application claims the benefit of the Korean Application No. P2003-101553 filed on Dec. 31, 2003, which is hereby incorporated by reference.

BACKGROUND OF THE INVENTION

1. Field of the Invention

The present invention relates to a CMOS image sensor and a method for fabricating the same, and more particularly, to a CMOS image sensor and a method for fabricating the same in which the boundary between an active region and a field region is not damaged by ion implantation.

2. Discussion of the Related Art

Generally, an image sensor means a semiconductor device converting optical images into electrical signals. The image sensor is divided into a charge coupled device (CCD) and a complementary MOS (CMOS) image sensor. The CCD transfers and stores charge carrier to and in a capacitor in a state that respective MOS capacitors lie adjacent to each other. The CMOS image sensor employs a switching mode that provides MOS transistors by the number of pixels using CMOS technology based on peripheral circuits such as a control circuit and signal processing circuit and that detects output signals of the MOS transistors.

The CCD has several drawbacks. That is, the CCD requires much power consumption and its driving mode is complicated. Also, since a lot of mask process steps are required, a signal processing circuit cannot be realized within a CCD chip.

To solve such drawbacks, studies of a CMOS image sensor based on sub-micron CMOS technology have been progressed recently. In the CMOS image sensor, images are realized by forming a photodiode and a MOS transistor within a unit pixel and detecting signals in a switching mode. In this case, less power consumption is required because the CMOS technology is used. Also, since twenty masks are required, the process steps are simpler than those of the CCD, which require thirty to forty masks. Thus, a signal processing circuit can be integrated within a single chip. This enables a small sized product and various applications of the product.

A related art CMOS image sensor will now be described with reference to FIG. 1 and FIG. 2. FIG. 1 and FIG. 2 are a circuit diagram and a layout illustrating a unit pixel structure of a related art CMOS image sensor. Although three or more transistors constituting a CMOS image sensor may be used, for convenience, a CMOS image sensor based on three transistors will be described.

As shown in FIG. 1 and FIG. 2, a unit pixel 100 of the CMOS image sensor includes a photodiode 110 and three NMOS transistors. The photodiode 110 serves as a sensor. Of the three transistors, a reset transistor Rx 120 transfers optical charges generated in the photodiode 110 and discharges the charges to detect signals. Another driver transistor Dx 130 serves as a source follower. Other select transistor Sx 140 is for switching and addressing.

Meanwhile, in the image sensor of the unit pixel, the photodiode 110 serves as a source of the reset transistor Rx 120 to facilitate charge transfer. To this end, the process steps of fabricating an image sensor of a unit pixel include the step of lightly or heavily implanting impurity ions into a region including some of the photodiode as shown in FIG. 2.

The process steps of fabricating an image sensor of a unit pixel corresponding to the section taken along line A-A' of FIG. 2 will be described with reference to FIG. 3A to FIG. 3C. For reference, a solid line of FIG. 2 denotes an active region 160.

As shown in FIG. 3A, a gate insulating film 122 and a gate electrode 123 are sequentially formed on a P type semiconductor substrate 101 in which a device isolation film 121 is formed by a shallow trench isolation (STI) process. In this case, although not shown, a P type epitaxial layer may previously be formed in the P type semiconductor substrate 101. Subsequently, a photoresist film is deposited on the entire surface of the semiconductor substrate 101. A photoresist pattern is then formed by a photolithography process to define a photodiode region. At this time, the gate electrode is not exposed by the photoresist pattern.

In this state, lightly doped impurity ions, for example, N type impurity ions are implanted into the entire surface of the semiconductor substrate to form a lightly doped impurity ion region in the semiconductor substrate 101 at a predetermined depth.

Subsequently, as shown in FIG. 3B, another photoresist pattern 125 is formed and a lightly doped impurity ion region for an LDD structure is formed in a drain region of the gate electrode using the photoresist pattern 125 as an ion implantation mask. At this time, the lightly doped impurity ion region is not exposed by the photoresist pattern 125.

Afterwards, as shown in FIG. 3C, a spacer 126 is formed at sidewalls of the gate electrode 123, and a P type impurity ion region $P^0$ is formed on the N type impurity ion region n−. Thus, the process steps of forming a photodiode are completed. In a state that the photodiode is completed, heavily doped impurity ions are selectively implanted into the drain region of the gate electrode 123 to form a heavily doped impurity ion region n+. Finally, the process steps corresponding to the section taken along line A-A' of FIG. 2 are completed.

In the method for fabricating the related art CMOS image sensor, lightly doped impurity ions are implanted into the active region and the device isolation film to form a photodiode. At this time, a defect occurs in a corresponding substrate due to ions implanted into the boundary between the device isolation film and the active region.

This defect due to ion implantation causes charge or hole carrier and provides a charge-hole recombination area, thereby increasing leakage current of the photodiode. That is, dark current occurs, in which electrons are transferred from the photodiode to the floating diffusion region in a state that there exists no light. The dark current is caused by either various defects, which are generated in the vicinity of the surface of silicon, the boundary between the device isolation film and $P^0$, the boundary between the device isolation film and n−, the boundary between $P^0$ and n−, P type region, and n− type region, or dangling bond. The dark current also deteriorates low illumination characteristics of the CMOS image sensor.

In the U.S. Pat. No. 6,462,365, a device isolation film and a transfer gate are formed in a portion corresponding to a photodiode region to reduce dark current generated by damage of a photodiode. Besides, while other various methods for minimizing dark current have been suggested, there is no effective method for solving a defect caused at the boundary between the device isolation film and the active region due to ion implantation.

SUMMARY OF THE INVENTION

Accordingly, the present invention is directed to a CMOS image sensor and a method for fabricating the same that substantially obviates one or more problems due to limitations and disadvantages of the related art.

An object of the present invention is to provide a CMOS image sensor and a method for fabricating the same in which the boundary between an active region and a field region is not damaged by ion implantation.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a CMOS image sensor includes a first conductive type semiconductor substrate having an active region defined by a field region, a photodiode formed in a predetermined portion of the active region, a device isolation film formed along the circumference of the photodiode, a first conductive type heavily doped impurity ion region formed at both sides of the device isolation film.

In another aspect, a method for fabricating a CMOS image sensor includes forming a trench in a first conductive type semiconductor substrate, forming a first conductive type heavily doped impurity ion region in the semiconductor substrate at both sides of the trench, forming a device isolation film by interposing an insulating film between the trench and the device isolation, sequentially forming a gate insulating film and a gate electrode on the semiconductor substrate, and forming a second conductive type impurity ion region for a photodiode in the semiconductor substrate between the gate electrode and the device isolation film.

Preferably, the step of forming a trench includes sequentially depositing a sacrificing oxide film and a hard mask layer on the semiconductor substrate, forming an opening of the sacrificing oxide film and the hard mask layer in a field region of the semiconductor substrate to expose the surface of the substrate in the opening, and forming the trench in the exposed substrate using the hard mask layer as an etching mask.

Preferably, the step of forming the first conductive type heavily doped impurity ion region includes implanting first conductive type heavily doped impurity ions into one side or both sides of the trench at a predetermined tilt angle θ against the substrate.

Preferably, the tilt angle θ depends on $\tan\theta = W/(H_1+H_2)$, wherein W representing the width between the device isolation film and the gate electrode, $H_1$ representing the depth of the second conductive type impurity ion for the photodiode region, and $H_2$ representing the height of a photoresist pattern used for the first conductive type half or heavily doped ion implantation.

Preferably, the first conductive type heavily doped impurity ion region has a width between 100 Å and 300 Å.

Preferably, the first conductive type impurity ions are either B ions or $BF_2$ ions.

Preferably, the first conductive type heavily doped impurity ion region is formed by ion implantation at the concentration of 1E12 to 1E15 ions/cm².

In forming the device isolation film surrounding the photodiode, since a heavily doped impurity ion region of P type conductivity opposite to the n− region of the photodiode is previously formed at both sides of the trench for the device isolation film, dark current caused by damage of the boundary between the device isolation film and the n− region of the photodiode can be minimized.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a CMOS image sensor according to the present invention and a method for fabricating the same will be described as follows.

Figure 6:
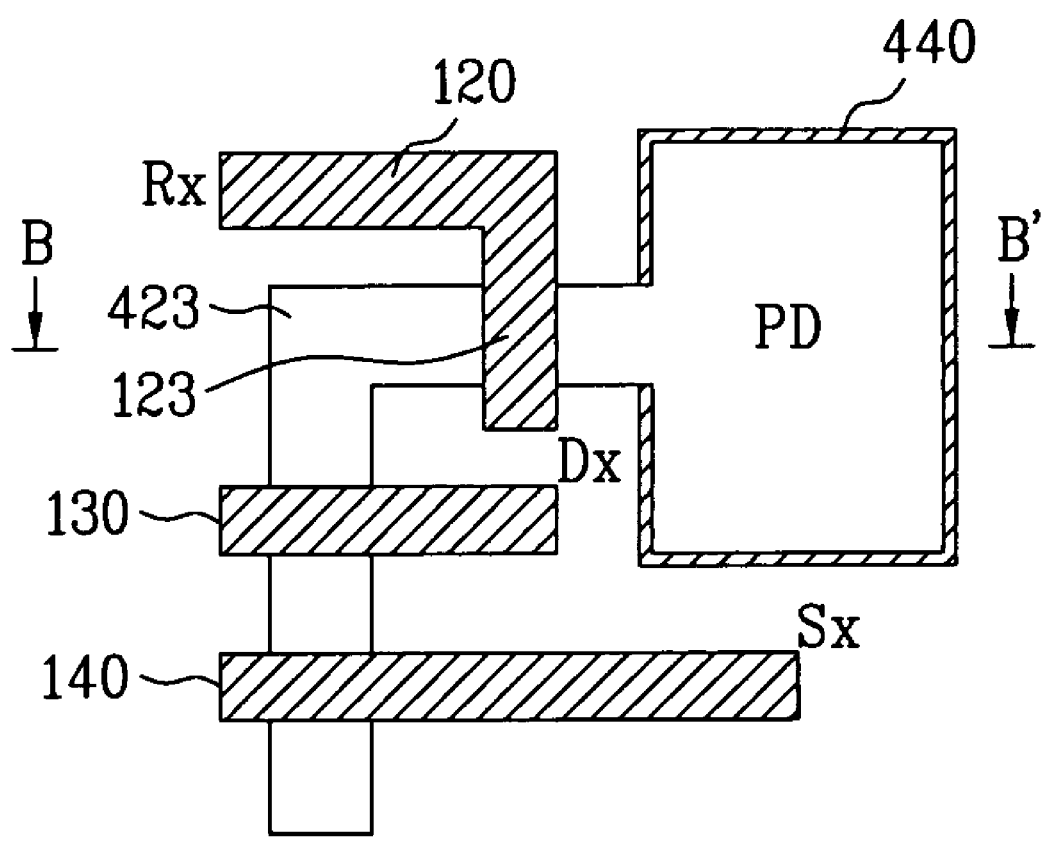
FIG. 6 is a layout illustrating a unit pixel of a CMOS image sensor according to the present invention.

FIG. 6 is a layout illustrating a unit pixel of a CMOS image sensor according to the present invention. As shown in FIG. 6, an active region is defined by a field region. The active region corresponds to a region inside a solid line 423 in FIG. 6. A gate electrode of a reset transistor Rx 120, a gate electrode of a driver transistor Dx 130, and a gate electrode of a select transistor Sx 140 are arranged to overlap a predetermined portion of the active region. A photodiode PD is formed at one side of the active region. An impurity ion region of the same conductive type as that of a semiconductor substrate, for example, a P type heavily doped impurity ion region P⁺ 440 is formed in the substrate along the inner side of the photodiode. That is, the P⁺ type region 440 is formed at the boundary between a device isolation film of the field region and the photodiode region.

The sectional structure of the CMOS image sensor, taken along line B-B' of FIG. 6, will be described with reference to FIG. 4.

Figure 1:
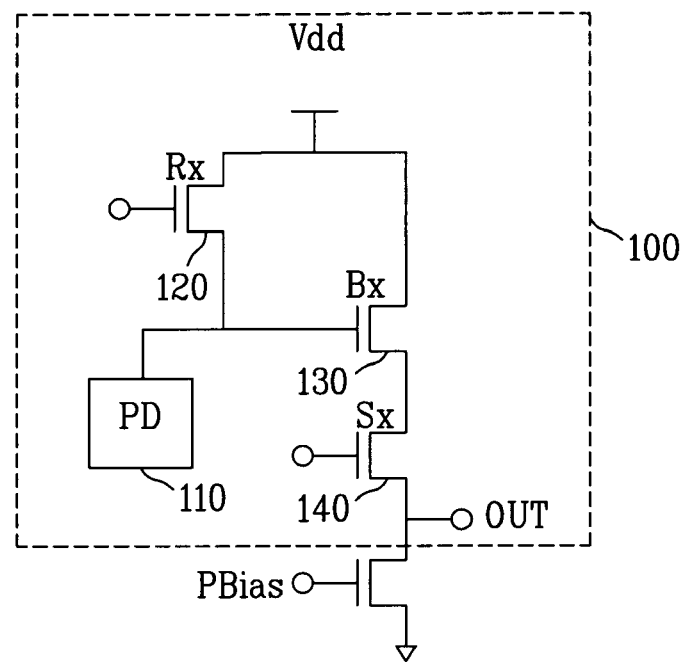
FIG. 1 is a circuit diagram illustrating a unit pixel structure of a related art CMOS image sensor.
Figure 2:
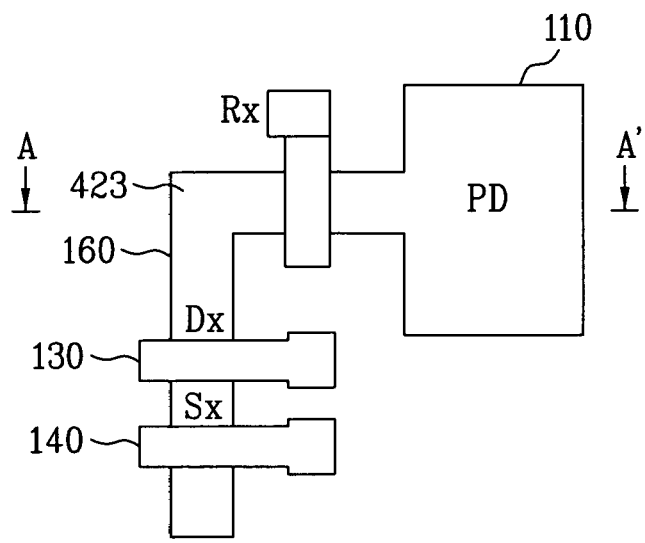
FIG. 2 is a layout illustrating a unit pixel of a related art CMOS image sensor.
Figure 3A:
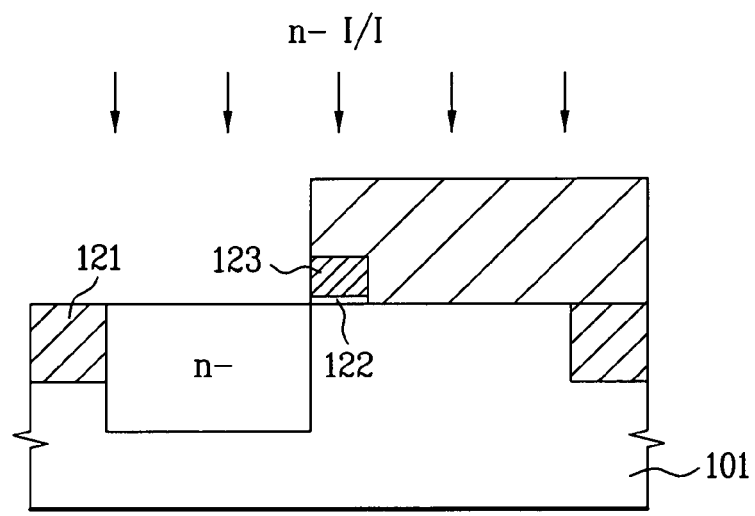
FIG. 3A to FIG. 3C are sectional views illustrating the process steps of fabricating a related art CMOS image sensor, taken along line A-A' of FIG. 2.
Figure 3B:
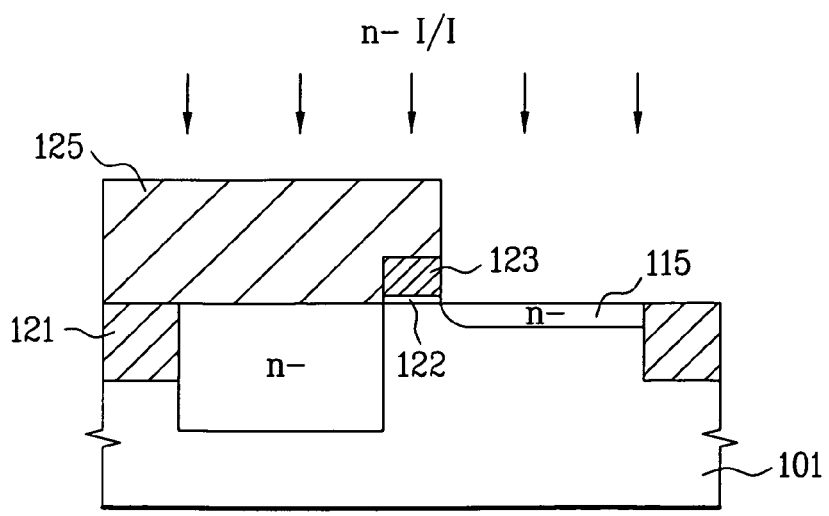
Figure 3C:
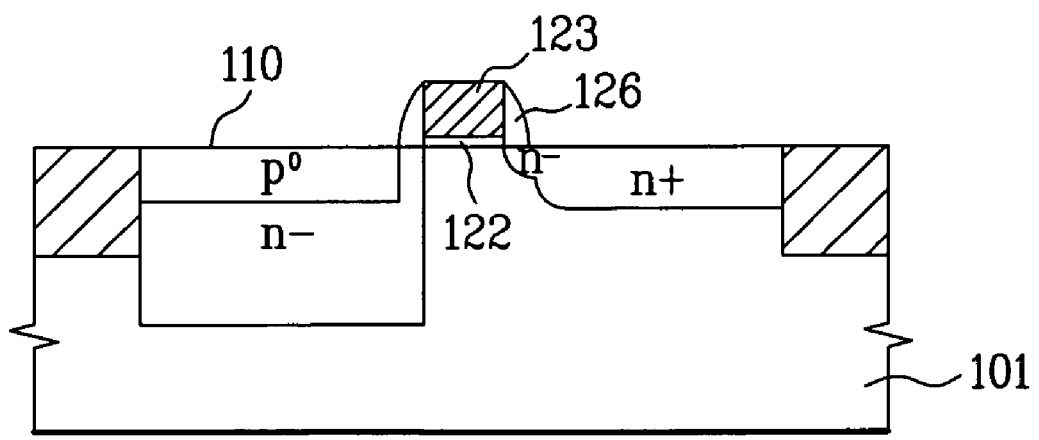
Figure 4:
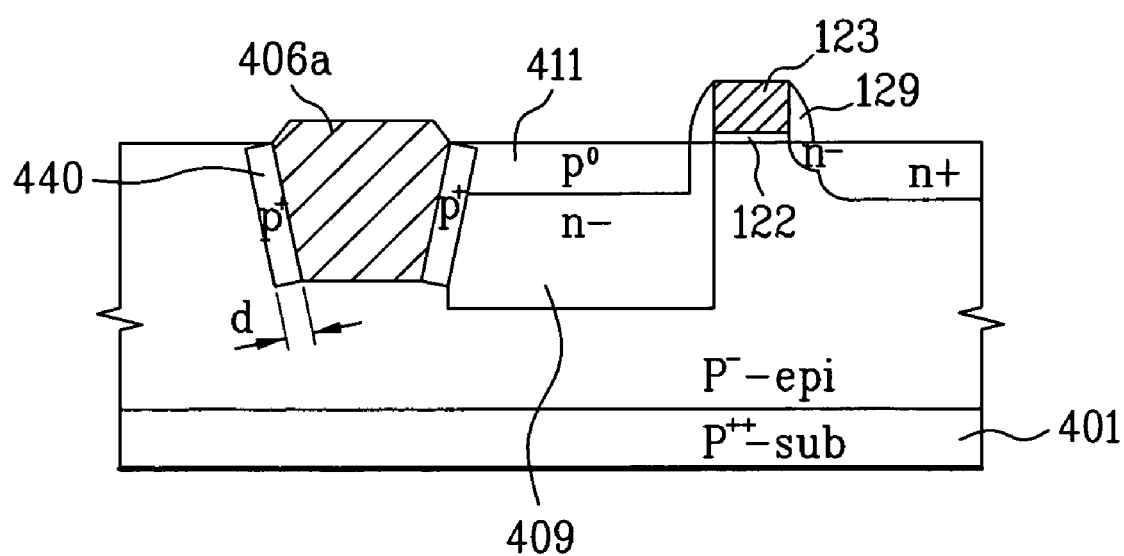
FIG. 4 is a sectional view illustrating a structure of a CMOS image sensor according to the present invention.

As shown in FIG. 4, a P⁻ type epitaxial layer is formed on a P⁺⁺ type semiconductor substrate 401. A device isolation film 406a is formed in the field region of the semiconductor substrate 401 to isolate the active region of the semiconductor substrate 401. A gate insulating film 122 and a gate electrode 123 are sequentially formed on a predetermined portion of the active region, and a spacer 129 is formed at sidewalls of the gate electrode 123 and the gate insulating film 122.

The photodiode region is defined by the gate electrode 123 and the device isolation film 406a. The photodiode region has a PN junction structure between an N type lightly doped impurity ion region n–409 and a P type epitaxial layer above the substrate 401. Also, a drain region n+having an LDD structure is formed in the substrate 401 at one side of the gate electrode 123.

Meanwhile, a P type heavily doped impurity ion region p+ 440 is formed at the boundary between the device isolation film, 406a and the photodiode region. The P type region p+ 440 prevents the boundary device isolation film 406a and the photodiode region from being damaged by ion implantation when the N type lightly doped impurity ion region n– 409 for the photodiode region is formed, and provides an electron-hole recombination area.

A method for fabricating the aforementioned CMOS image sensor according to the present invention will be described in more detail.

Figure 5A:
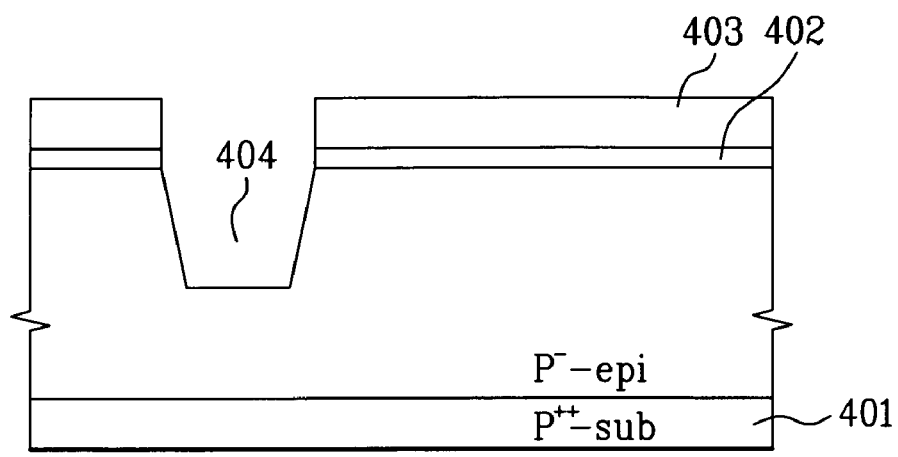
FIG. 5A to FIG. 5G are sectional views illustrating the process steps of fabricating a CMOS image sensor according to the present invention.

As shown in FIG. 5A, a sacrificing oxide film 402 is grown on a semiconductor substrate 401, for example, a P type monosilicon substrate $P^{++}$-sub 401 at a thickness of 40 Å to 150 Å by a thermal oxidation process of high temperature. A $P^-$ type epitaxial layer $P^-$-epi may previously be formed in the semiconductor substrate 401. The $P^-$ type epitaxial layer deeply forms a depletion region in a photodiode so as to increase capability of a low voltage photodiode that collects optical charges and to improve optical sensitivity.

Subsequently, a sacrificing nitride film 403 is deposited on the sacrificing oxide film 402 by a low pressure chemical vapor deposition process at a thickness of 500 Å to 1500 Å. The sacrificing nitride film 403 is used as a hard mask layer. The sacrificing oxide film 402 is to relieve stress of the semiconductor substrate 401 and the sacrificing nitride film 403. The sacrificing nitride film 403 is used as an etching mask layer when a trench is formed and serves as an etching stopper film during a later chemical mechanical polishing process.

Afterwards, a photoresist pattern (not shown) is formed on the active region of the substrate 401 so that an opening of the photoresist pattern is positioned in the field region of the substrate 401. The sacrificing oxide film 402 and the sacrificing nitride film 403 in the opening are completely etched by a dry etching process having anisotropic etching characteristics, for example, a reactive ion etching (RIE) process using the photoresist pattern as an etching mask, so that the field region of the substrate 401 is exposed. The photoresist pattern is then removed.

Subsequently, the substrate 401 of the exposed field region is etched at a shallow depth of 3000 Å by the RIE process using the remaining sacrificing nitride film 403 as an etching mask layer. Thus, a trench 404 is formed in the field region of the substrate 401.

Figure 5B:
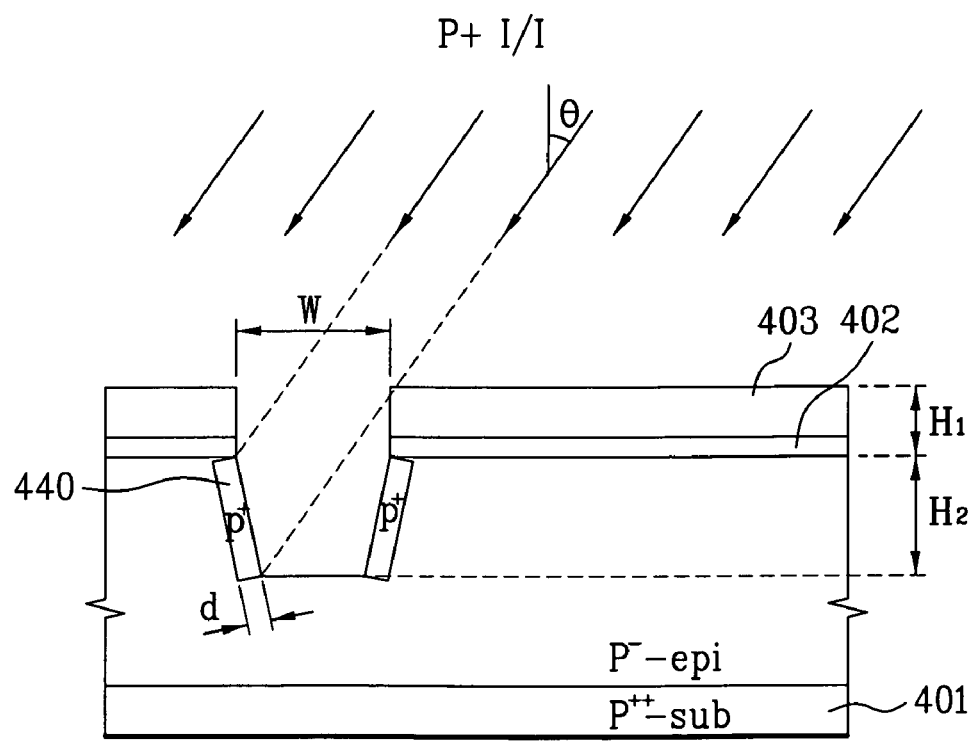

In this state, as shown in FIG. 5B, P type heavily doped impurity ions, for example, B ions or $BF_2$ ions are implanted into the substrate 401 by a predetermined tilt angle at the concentration of IE12 to IE15 ions/cm² using the remaining sacrificing nitride film 403 as an ion implantation mask. Thus, a P type heavily doped impurity ion region p+ 440 is formed in the substrate 401 at the side of the trench 404. Preferably, the P type region 440 has a width d of 100 Å to 300 Å.

At this time, the ion implantation angle for the $P^+$ type region is determined considering some factors such as the width W of the trench 404, its depth $H_2$, and the height $H_1$ of the sacrificing oxide film 402 and the sacrificing nitride film 403 on the substrate 401. The relation among the factors is expressed as follows.

$$\tan \theta = W/(H_1 + H_2)$$

The $P^+$ type region 440 is formed at the boundary between the n– region for the photodiode and the device isolation film 406a to reduce dark current. In more detail, a defect caused by implantation of impurity ions n– for the photodiode occurs at the boundary between the device isolation film 406a and the photodiode region. The defect causes charge carrier, and the charge carrier is transferred to a floating diffusion region, thereby causing dark current. The $P^+$ type region captures the charge carrier and prevents the dark current from occurring in advance.

Meanwhile, ion implantation into one side of the trench 404 is performed more than one time at a tilt angle in a particular direction. Then, P type heavily doped impurity ions are implanted into the other side of the trench 404 at a tilt angle in a direction opposite to the above particular direction. Thus, P type heavily doped impurity ion regions 440 are formed in the substrate 401 at both sides of the trench 404 in the same shapes as each other.

Figure 5C:
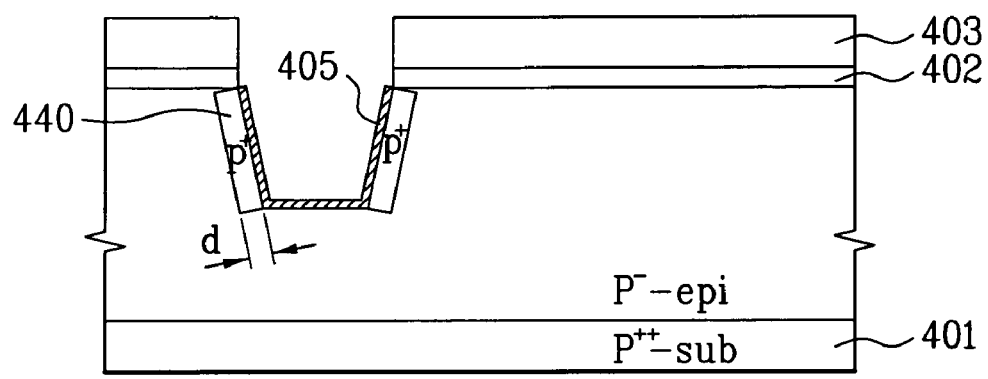

In a state that the P type heavily doped impurity ion regions 440 are formed at both sides of the trench 404, as shown in FIG. 5C, an insulating film, for example, a thermal oxide film 405 is grown on the semiconductor substrate 401 in the trench 404 at a thickness of 200 Å to 400 Å by a thermal oxidation process. The thermal oxide film 405 is to remove damages caused by plasma and the P type heavily doped ion implantation after the trench 404 is formed. In more detail, the thermal oxide film 405 is to remove dangling bond existing in atomic arrangement on the semiconductor substrate 401 in the trench 404. Also, the thermal oxide film 405 serves to improve junction characteristic with the device isolation film 406a which is to be formed later. Since the thermal oxide film 405 is optionally formed, the subsequent process may be performed without forming the thermal oxide film 405.

Figure 5D:
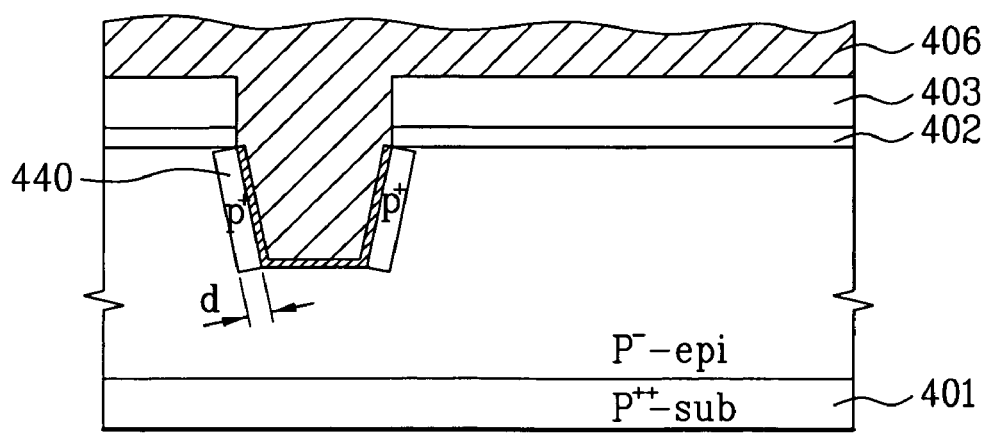

As shown in FIG. 5D, an insulating film 406 for device isolation is thickly deposited on the entire surface of the substrate 401 including the trench 404 and the sacrificing nitride film 403 outside the trench 404 to sufficiently bury the trench 404. At this time, it is preferable that a void is not formed in the insulating film 406 inside the trench 404. The insulating film 406 may be deposited by an $O_3$-tetra-ethyl-ortho-silicate ($O_3$-TEOS) atmosphere pressure chemical vapor deposition (APCVD) process or a high density plasma chemical vapor deposition (HDP CVD) process depending on a design rule of a semiconductor substrate.

The insulating film 406 has been described based on a single layered structure, it may have a multi-layered structure, for example, a double layered structure of oxide and nitride films.

Figure 5E:
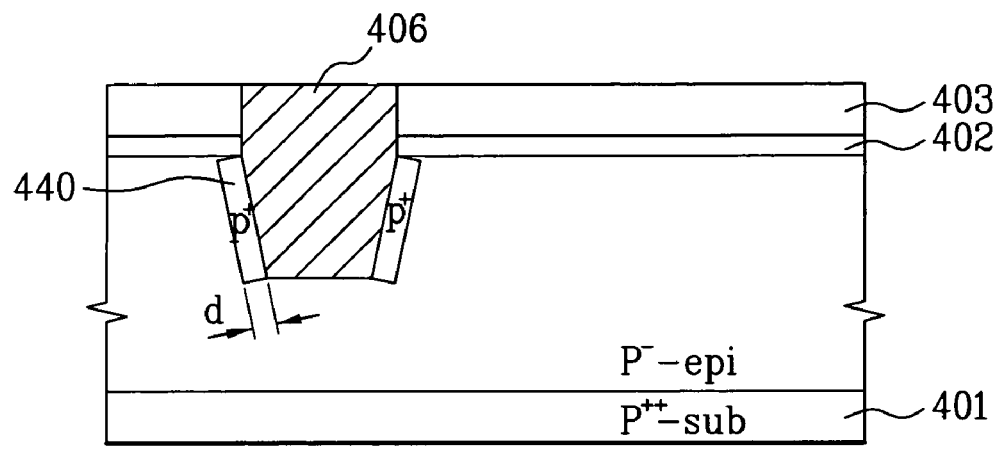
Figure 5F:
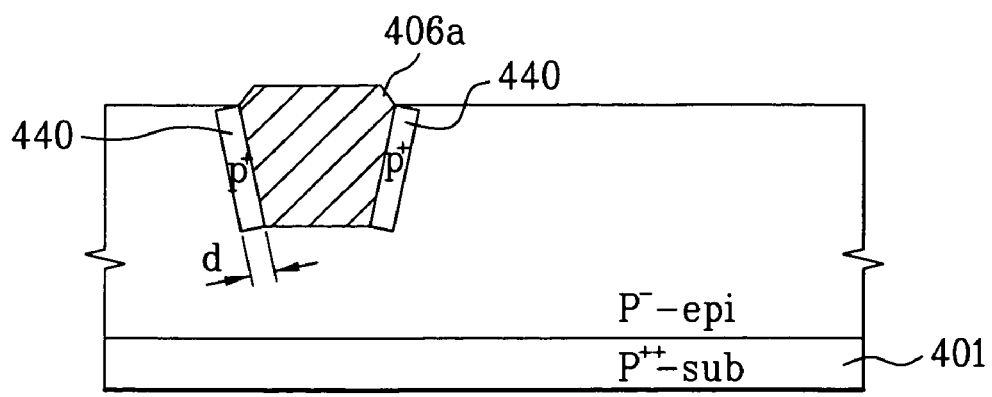

Subsequently, as shown in FIG. 5E, the insulating film 406 is polished by a chemical mechanical polishing process to be flush with the sacrificing nitride film 403. The insulating film 406 is then densely maintained by a thermal annealing process of high temperature. Afterwards, as shown in FIG. 5F, the sacrificing nitride film 403 and the sacrificing oxide film 402 are removed by an etching process using HF solution to form the device isolation film 406a in the trench 404.

In a state that the device isolation film 406a of the CMOS image sensor is formed as above, the typical process steps of fabricating a CMOS image sensor are performed. The device isolation film 406a is formed to surround the photodiode region of FIG. 6.

Figure 5G:
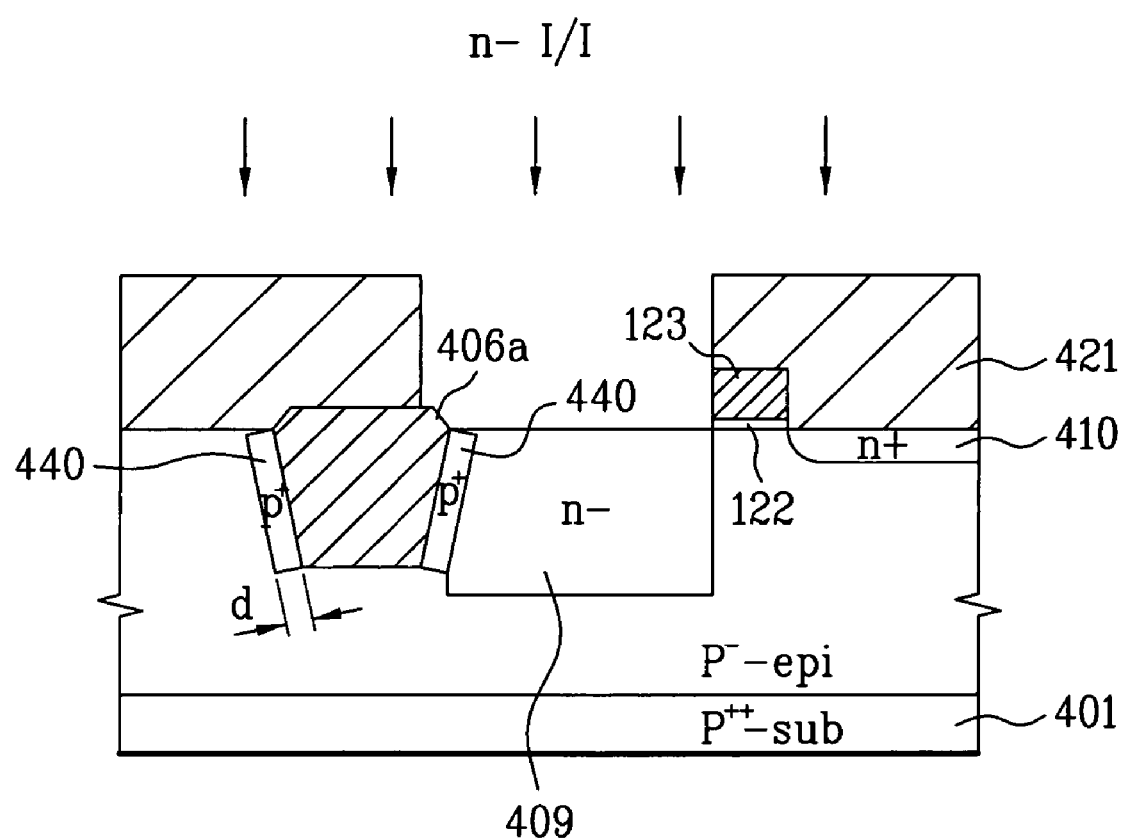

As shown in FIG. 5G, the gate insulating film 122 and the gate electrode 123 are sequentially formed on a predetermined portion of the active region. The gate electrode 123 may be one of the reset transistor, and corresponds to one of the transfer transistor in case of a CMOS image sensor based on four transistors. A lightly doped impurity ion region may be formed after impurity ion implantation for the photodiode.

In this state, the photoresist film is deposited on the entire surface of the substrate 401 and is selectively patterned to form the photoresist pattern that defines the photodiode region. That is, the surface of the substrate 401 between the gate electrode 123 and the device isolation film 406a is exposed by the photoresist pattern, Then, the lightly doped impurity ions are implanted into the entire surface of the substrate 401 to form the photodiode. Thus, a lightly doped impurity ion region n– 409 for the photodiode is formed and the photodiode having a PN junction structure with the P⁻ type epitaxial layer P⁻-epi of the substrate 401 is completed.

Since the lightly doped impurity ion region n– 409 adjoins the device isolation film 406a, problems such as electron or hole carrier and leakage current may be caused at the boundary between the device isolation film 406a and the photodiode region. However, since the P type heavily doped impurity ion region is previously formed at the side of the device isolation film 406a and provides an electron-hole recombination area, such problems caused by ion implantation for the formation of the n– region can be avoided in advance.

Afterwards, although not shown, P type half doped impurity ions are implanted into the substrate 401 of the photodiode region and a floating diffusion region is formed. Then, the method for fabricating the CMOS image sensor according to the present invention is finally completed.

As aforementioned, the CMOS image sensor and the method for fabricating the same have the following advantages.

In forming the device isolation film surrounding the photodiode, since a heavily doped impurity ion region of P type opposite to the n– region of the photodiode is previously formed at both sides of the trench for the device isolation film, dark current caused by damage of the boundary between the device isolation film and the n– region of the photodiode can be minimized.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a CMOS image sensor comprising:
forming a trench in a field region of a first conductive type semiconductor substrate having a first conductive type low concentration epitaxial layer; forming a first conductive type heavily doped impurity ion regions in the first conductive type low concentration epitaxial layer, at sidewalls of the trench by implanting first conductive type heavily doped impurity ions into both sides of the trench at a predetermined tilt angle θ against the substrate, the tilt angle θ being chosen such that the first conductive type heavily doped impurity ions are not implanted into a bottom of the trench, wherein the tilt angle θ depends on tan θ=W/(H₁+H₂), with W representing a width of the trench at a top surface of the trench, H₁ representing a height of a sacrificial layer formed on the substrate, and H₂ representing a depth of the trench; forming a first insulating film in the trench such that the first insulating film covers the first conductive type impurity ion regions; forming a device isolation film by depositing a second insulating film in the trench; sequentially forming a gate insulating film and a gate electrode on the semiconductor substrate; and forming a second conductive type impurity ion region for a photodiode at a predetermined portion of an active region in the first conductive type low concentration epitaxial layer.

2. The method of claim 1, wherein the step of forming a trench includes sequentially depositing the sacrificial layer comprising a sacrificing oxide film and a hard mask layer on the epitaxial layer, forming an opening of the sacrificing oxide film and the hard mask layer in said field region of the semiconductor substrate to expose the surface of the epitaxial layer in the opening, and forming the trench in the exposed epitaxial layer using the hard mask layer as an etching mask.

3. The method of claim 1, wherein at least one of the first conductive type heavily doped impurity ion regions has a width between 100Å and 300Å.

4. The method of claim 1, wherein the first conductive type impurity ions are either B ions or BF₂ ions.

5. The method of claim 1, wherein at least one of the first conductive type heavily doped impurity ion regions is formed by ion implantation at the concentration of 1E12 to 1E15 ions/cm₂.

6. The method of claim 1, wherein forming the first insulating film comprises growing a thermal oxide film on the semiconductor substrate in the trench by a thermal oxidation process.

* * * * *